United States Patent [19]

Dykstra et al.

[11] Patent Number: 5,091,655
[45] Date of Patent: Feb. 25, 1992

[54] REDUCED PATH ION BEAM IMPLANTER

[75] Inventors: Jerald P. Dykstra; Andrew M. Ray; Monroe L. King, all of Austin, Tex.

[73] Assignee: Eaton Corporation, Cleveland, Ohio

[21] Appl. No.: 660,738

[22] Filed: Feb. 25, 1991

[51] Int. Cl.[5] ......................................... H01V 37/317
[52] U.S. Cl. ................. 250/492.2; 250/398;
313/360.1; 313/361.1
[58] Field of Search ............... 250/492.2, 492.21, 398;
313/360.1, 361.1

[56] References Cited

U.S. PATENT DOCUMENTS

| | | | |
|---|---|---|---|
| 3,731,211 | 5/1973 | Purser | 313/361.1 |
| 4,276,477 | 6/1981 | Enge | 250/398 |
| 4,383,180 | 5/1983 | Turner | 250/492.21 |
| 4,661,712 | 4/1987 | Mobley | 250/492.2 |
| 4,687,936 | 8/1987 | McIntyre et al. | 250/397 |
| 4,782,304 | 11/1988 | Aitken | 250/492.21 |
| 4,794,305 | 12/1988 | Matsukawa | 315/111.81 |
| 4,922,106 | 5/1990 | Berrian et al. | 250/492.2 |
| 4,942,342 | 7/1990 | Tsukakoshi | 315/410 |

OTHER PUBLICATIONS

Nissin Electric; Ion Implantation System Type NH-20SP; Cat. No. 1418.
New Generation Ion Implanter for Sub-Micron Era ULVAC Corporation; Model IPX-7000.

Primary Examiner—Jack I. Berman
Attorney, Agent, or Firm—Watts, Hoffman, Fisher & Heinke

[57] ABSTRACT

An ion beam implantation system. An ion beam is controllably deflected from an initial trajectory as it passes through spaced parallel plates that are biased by a control circuit. Once deflected, the ion beam enters an accelerator that both redeflects the once deflected ion beam and acceleratres the ions to a desired final energy. When the beam exits the accelerator it moves along a trajectory that impacts a workpiece. Ions making up the ion beam all impact the workpiece at a uniform, controlled impact angle.

19 Claims, 4 Drawing Sheets

REDUCED PATH ION BEAM IMPLANTER

FIELD OF THE INVENTION

The present invention concerns an ion implanter for treating workpieces and more specifically concerns an ion implanter that is particularly suited for implanting semiconductor wafers with doping impurities.

BACKGROUND ART

It is known in the semiconductor fabrication art to use an ion beam to dope semiconductor wafers with ion impurities. By scanning an ion beam across a wafer surface or moving the wafer through a stationary beam the wafer can be uniformly doped.

The angle at which an ion beam impacts a wafer surface (wafer tilt) is an important parameter in ion implantation of the wafer. Recent trends in semiconductor material processing require a decreased ion impact angle variation across the wafer surface.

In a scanning ion beam system, electrostatic deflection plates produce a raster pattern of ion beam impingement on the wafer surface. One set of plates produces a rapid back and forth scan in one direction and a second set of plates provides beam deflection in an orthogonal direction. Such raster scanning results in impact angle variations of $\pm 4°$ across a 200 mm wafer for a typical ion beam geometry.

Methods have been proposed to reduce this impact angle variation. One proposal suggests using four sets of deflection plates, two horizontal and two vertical, and is referred to as a double deflection system. The beam is first deflected away from an initial trajectory and then, just before striking the wafer, is deflected again to return to a direction parallel to its original, undeflected trajectory.

Use of a double deflection system with large wafer diameters requires deflection plates that are more widely spaced. This requires high deflection voltages that must be scanned and precisely synchronized with the scanning voltages applied to the first set of deflection plates. Another problem is that as the opening in the scan plates increases, electrostatic fringing fields become more difficult to control and become more susceptible to beam space charge effects.

Another known method of reducing tilt variations is to use a mechanically scanned, spinning disk wafer support. If the spin axis is parallel to the beam, no impact angle variations are present. Spinning disk supports have problems achieving control over impact angle while maintaining the necessary condition for an impact angle variation. One example of a prior art patent having a spinning workpiece support is U.S. Pat. No. 4,794,305 to Matsukawa.

Another more recent approach is to electrostatically scan the beam in one axis, and then use a highly indexed bending magnet to produce a parallel ribbon beam. The wafer is then scanned mechanically in a direction orthogonal to the ribbon beam to produce a uniform two dimensional implant. U.S. Pat. Nos. 4,276,477 to Enge, 4,687,936 to McIntyre et al. and 4,922,106 to Berrian et al. disclose such systems.

DISCLOSURE OF THE INVENTION

The disclosed ion beam implant system treats a workpiece, typically a semi-conductor wafer, by causing ions to impact the wafer at a controlled, uniform angle.

Ions emitted by an ion source are analyzed by a mass analyzing magnet. The analyzing magnet causes ions of a proper mass to form an ion beam moving in a first trajectory. An electrode pair deflects ions away from this first trajectory by a controlled amount to produce a side to side scan. A beam accelerator accelerates ions deflected by the controlled amount before they impact the workpiece. A control circuit having an output coupled to the side to side scan electrode pair adjusts the deflecting of the ion beam and thereby controls ion beam treatment of the workpiece.

The beam accelerator includes an entrance electrode biased at a control voltage for creating a non-uniform electric field. In the disclosed and preferred design this entrance electrode forms an arcuate or curved conductive electrode. The non-uniform electric field causes ions following diverse trajectories to be redeflected so they impact the workpiece at a relatively uniform angle. One or more additional electrodes accelerate the ions after they have been redeflected so they impact the workpiece with an appropriate energy.

Use of an electrode that forms a part of the beam accelerator for redeflecting the ions shortens the ion beam path to the workpiece. Stated another way, both ion redeflection and acceleration may be accomplished with one beam path defining structure.

This and other objects, advantages and features of the invention will become better understood from the accompanying detailed description of one embodiment of the invention which is described in conjunction with the accompanying drawings.

BEST MODE FOR CARRYING OUT THE INVENTION

Figure 1:
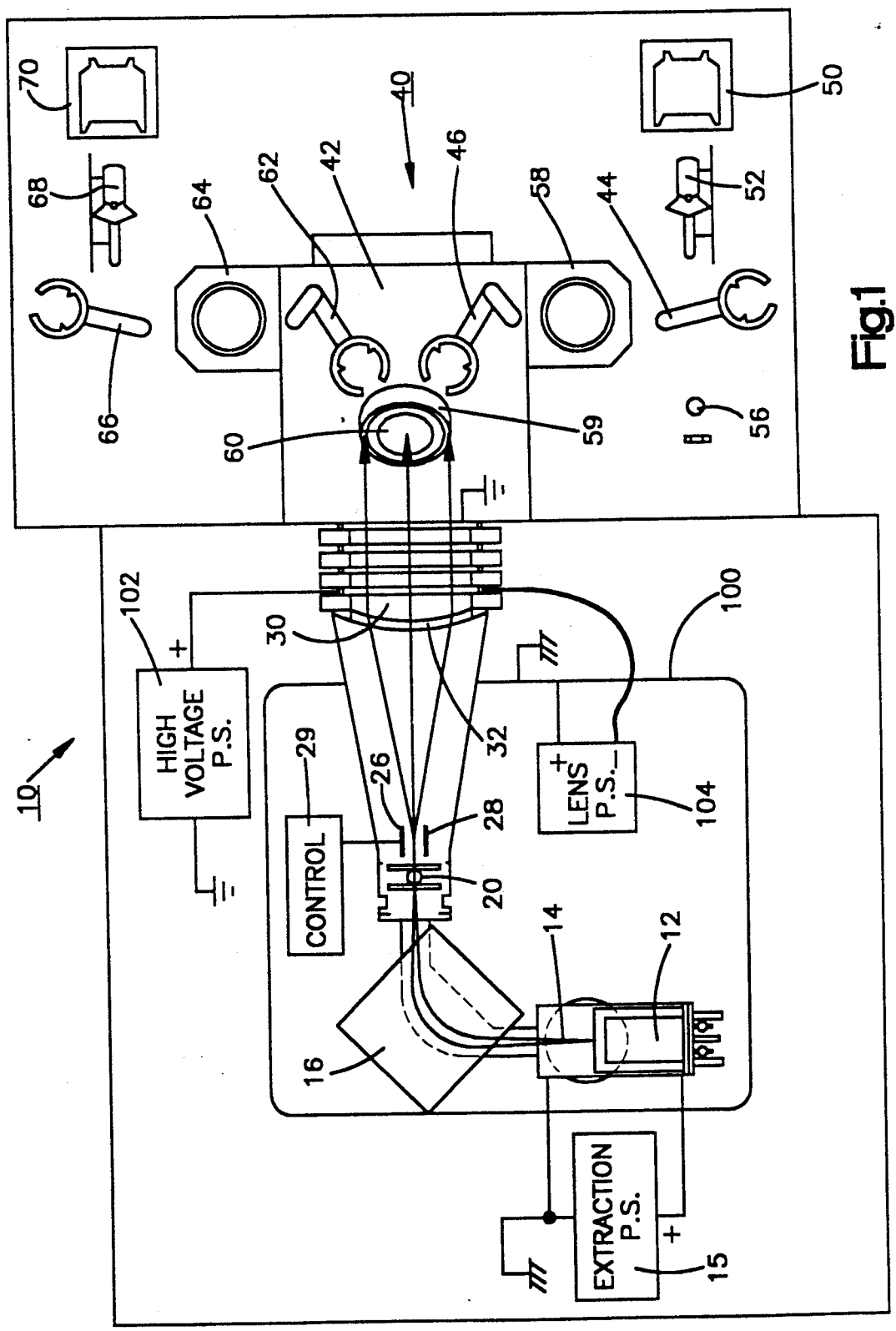
FIG. 1 is a schematic of an ion implantation system constructed in accordance with the invention.

Turning now to the drawings, an ion implantation system 10 is illustrated having an ion source 12 for generating an ion beam 14. An extraction power supply 15 biases an extraction electrode to a potential (approximately 20 kV) that accelerates the ions from the source 12 along a trajectory leading to an ion mass analyzing magnet 16. The magnet 16 bends the beam at approximately a right angle and directs ions having an appropriate mass along a travel path through a shutter 20. The shutter 20 rejects ions having an inappropriate mass from the ion beam 14.

The beam 14 then passes through a pair of deflection electrodes 26, 28. Control voltages applied to the electrodes 26, 28 by a control circuit 29 cause the ion beam to pass through electric fields which deflect the ion beam 14 by a controlled amount. The magnitude of the voltage difference between the two plates 26, 28 controls the amount of deflection. The deflected ion beam enters a beam accelerator 30 where ions are redirected along a travel path generally parallel to the trajectory they follow as they exit the analyzing magnet 16. The beam accelerator 30 includes a curved metallic entrance electrode 32 and a plurality of spaced, parallel metallic plates 34 a–d (FIG. 2). After passing through the accelerator 30 the ions in the beam have been both redirected to a desired trajectory and accelerated to a final implantation energy.

Downstream from the beam accelerator 30, an ion implantation station 40 includes structure that supports a semiconductor wafer 60 at a position to intercept ions that have been accelerated by the parallel plates 34 a–d. Ion beam collisions with other particles degrade beam integrity so that the entire beam line from the source 12 to the implantation station 40 is evacuated. At the region of the ion implantation station 40 a chamber 42 is evacuated and the wafers are inserted into and withdrawn from load locks to avoid repeated pressurization and depressurization of the chamber 42. A mechanized arm 44 located outside the chamber 42 grasps a wafer supported on a shuttle 52 that has obtained the wafer from a cassette 50. The arm 44 first positions each undoped wafer on a wafer orienter 56. The orienter 56 rotates the undoped wafer to a particular orientation before ion implantation so that as ions strike the wafer they encounter a specific orientation of the crystal lattice structure. The wafer is then moved into a load lock 58 so that a second arm 46 can move the wafers to an implant position within the chamber 42. At the implantation site a wafer support 59 orients the wafer 60 with respect to the ion beam at a specific tilt angle that remains constant.

The scanning electrodes 26, 28 produce side-to-side beam scanning of a controlled amount under the direction of the control circuitry 29. The circuitry includes a programmable controller for adjusting the scanning electrode voltages to achieve this wafer scanning. The particular system depicted in FIG. 1 produces only side-to-side scanning so that to implant an entire workpiece surface of a circular wafers depicted in FIG. 1, an additional relative motion between the deflected ion beam and the workpiece is necessary. In this implementation, a linear back and forth scan of a wafer 60 (perpendicular to the plane of the ribbon ion beam) is achieved through suitable drive mechanisms (not shown) attached to the support 59.

Once the wafer 60 has been doped by treatment with the ion beam, the wafer is removed from the implantation station 40 by a third arm 62. This arm 62 delivers the wafer 60 to a load lock 64 so that a fourth mechanized arm 66 can transfer the wafer to a shuttle 68 that moves the doped wafer to a cassette 70.

Figure 2A:
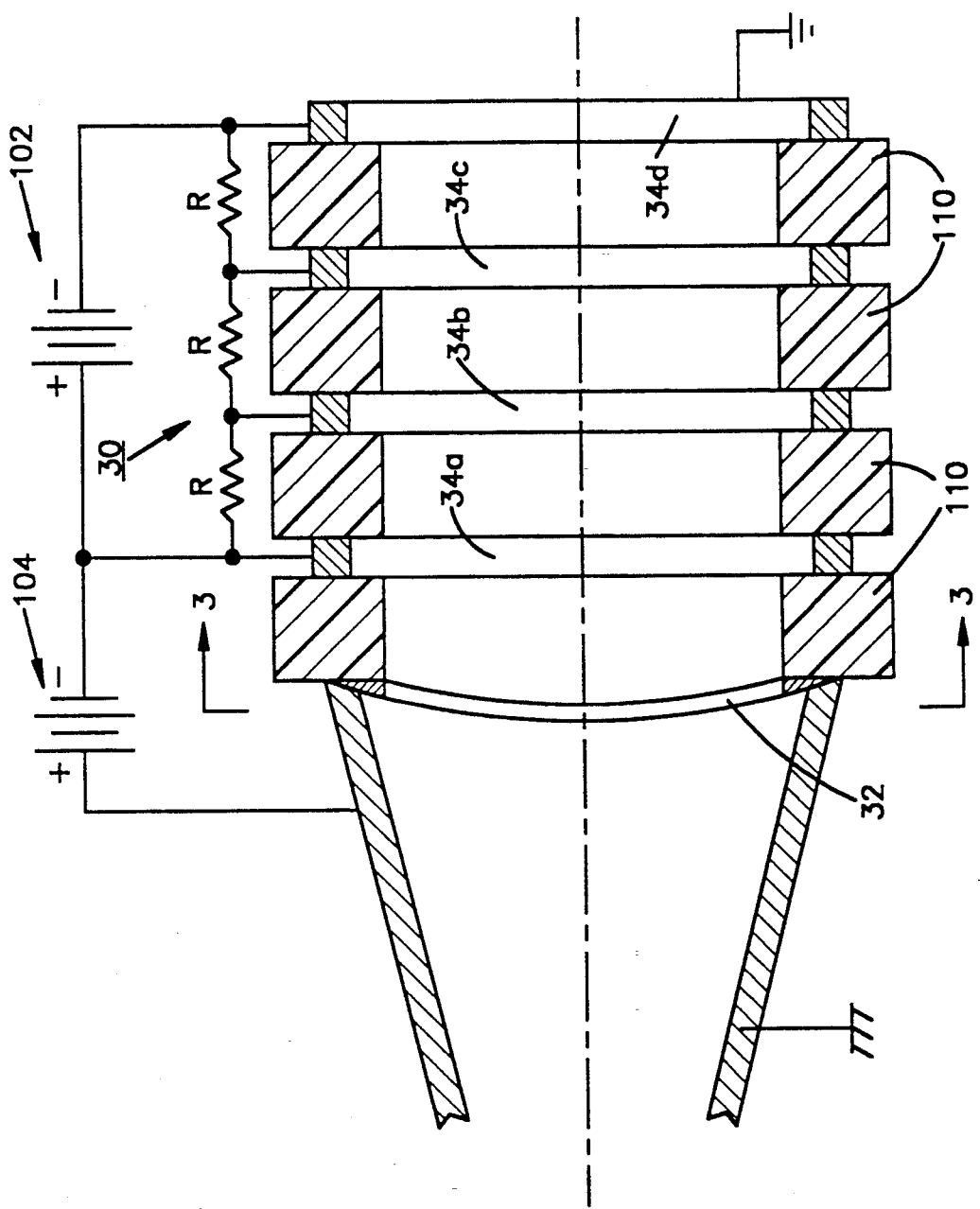
FIG. 2A is an enlarged plan view of an ion beam accelerator.

As seen most clearly in FIGS. 1 and 2, the entrance electrode 32 of the accelerator 30 is constructed from an arcuate entrance curved conductor. This electrode 32 is maintained at the same potential as a housing 100 which supports the source 12, the analyzing magnet 16, and the deflection electrodes 26, 28. A second electrode 34a (FIG. 2A) is positively biased by a high voltage power supply 102 (FIG. 1). The voltage difference between the curved electrode 32 and the first generally planer electrode 34a is maintained by a lens power supply 104.

Figure 3:
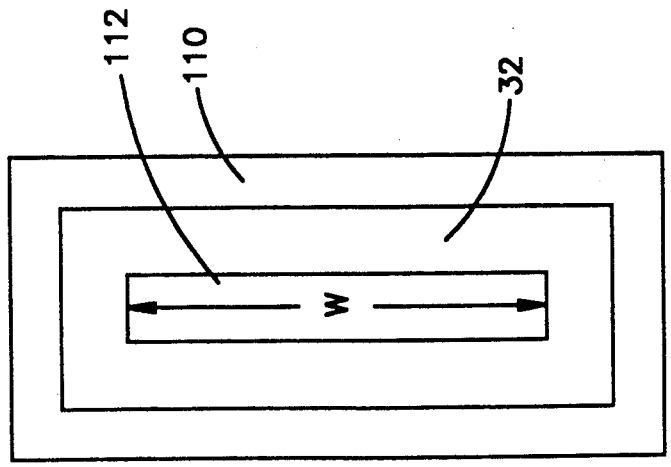
FIG. 3 is an elevation view of an input portion of the ion beam accelerator.

Representative voltages of approximately 60 kilovolts for the lens power supply 104, 20 kilovolts for the extraction power supply 15, and 120 kilvolts for the high voltage power supply 102 accelerate the positively charged ions to a final energy of approximately 200 keV. These voltages are appropriate for the FIG. 2A implantation system having a curved entrance electrode 32 having an entrance surface that is approximately circular in section with a radius of curvature of 13 inches and which is spaced approximately 24 inches from the scan vertex at the position of the deflection electrodes 26, 28. The width W (FIG. 3) of the entrance aperture 112 defined by the electrode 32 for this arrangement is approximately 12 inches.

Figure 2B:
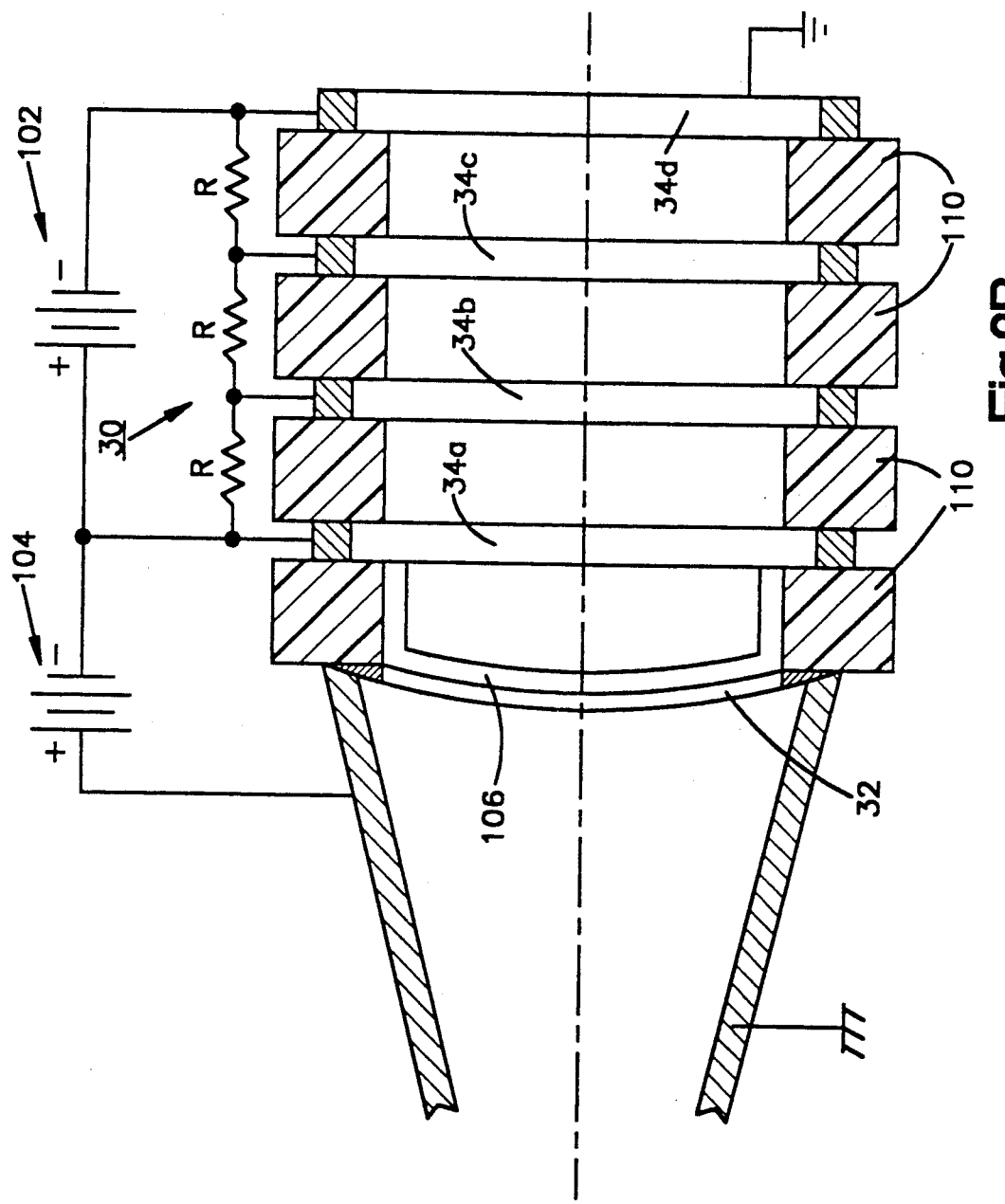
FIG. 2B is an enlarged plan view of an alternate embodiment of an ion beam accelerator.

In the FIG. 2B embodiment of the invention, the electrode 34a has an entrance face 106 having a curvature approximately the same as the curvature of the front and back surfaces of the entrance electrode 32. In this embodiment, it can be said that the surface 106 "parallels" the contour of the curved electrode 32. In general, the electrode 34a can be curved, flat or curved with a shape different than the electrode 32.

As seen in FIGS. 2A and 2B, the electrodes 34a–34d are separated by insulators 110 which electrically isolate each electrode from an adjacent electrode as well as space the electrodes relative to each other. Three bias resistors R are coupled to the electrodes 34a, 34b, 34c, 34d and across the power supply 102 to produce approximately the same voltage difference between adjacent electrodes. Each resistor has a resistance of approximately 50 megohms.

Figure 4:
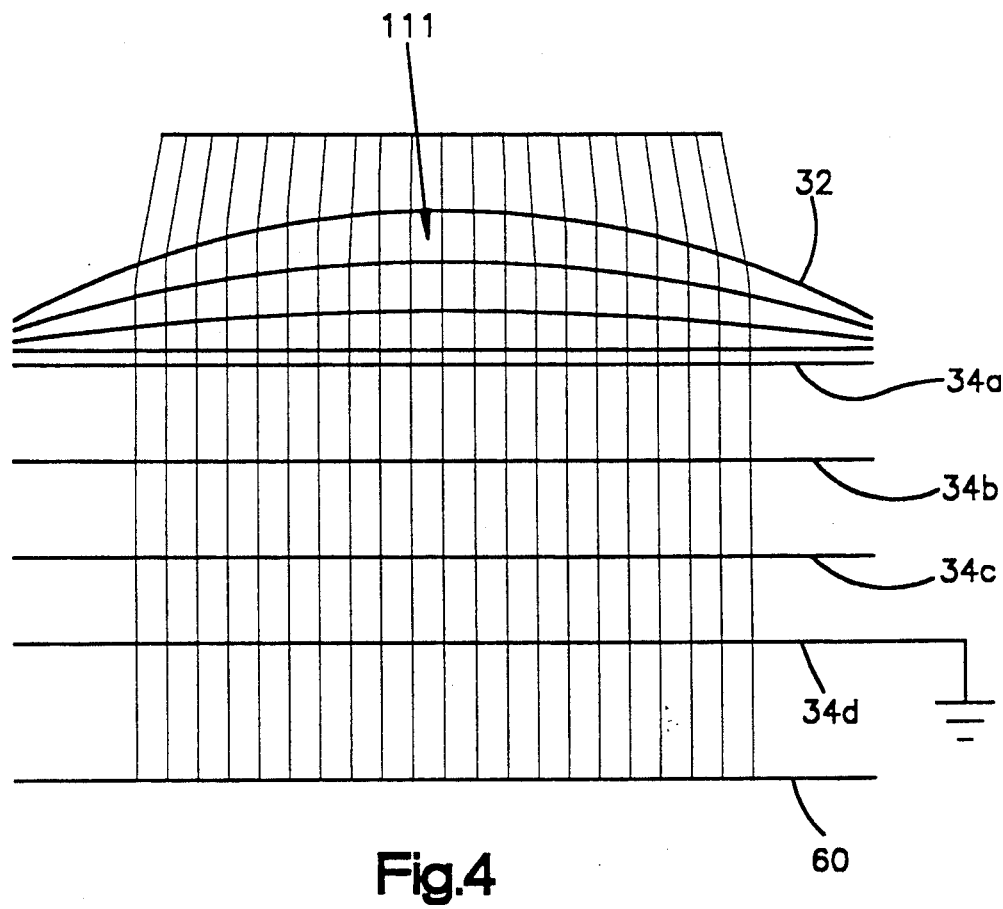
FIG. 4 is a schematic showing electric field lines created by the accelerator shown in FIG. 2A for redeflecting and accelerating ions.

Equi-potential field lines III for the FIG. 2A embodiment are shown in FIG. 4 to illustrate the effect the beam accelerator 30 has on ions passing through the curved entrance electrode 32 and subsequent planar electrodes 34a–34d. The equi-potential lines in the region between the entrance electrode 32 and the planar electrode 34a are curved. The equi-potential lines between the first planar electrode 34a and the last planar electrode 34d are generally parallel and perpendicular to the ion trajectory. The electric field set up by the accelerator 30 redeflects ions moving in divergent paths due to the side to side scanning of the electrodes 26,28 into paths which are generally parallel to each other. The redeflected ions are accelerated and exit the accelerator 30 having trajectories which cause the ions to impact a target 60 at a relatively uniform impact angle. By appropriate orientation of the support, this angle can be perpendicular or at other predetermined impact angles.

The side to side scanning produced by the control circuitry 29 allows the shape of an aperture 112 defined by the electrodes 32, 34a–d to be an elongated narrow slot through which the deflected ions can enter the accelerator 30 for redeflection and acceleration. Since the typical use of the ion implantation system 10 is for doping circular or generally circular semiconductor wafers, a back and forth scan of the workpiece 60 through the resulting ribbon ion beam is accomplished by mechanical translation of the wafer support 59.

Figure 5:
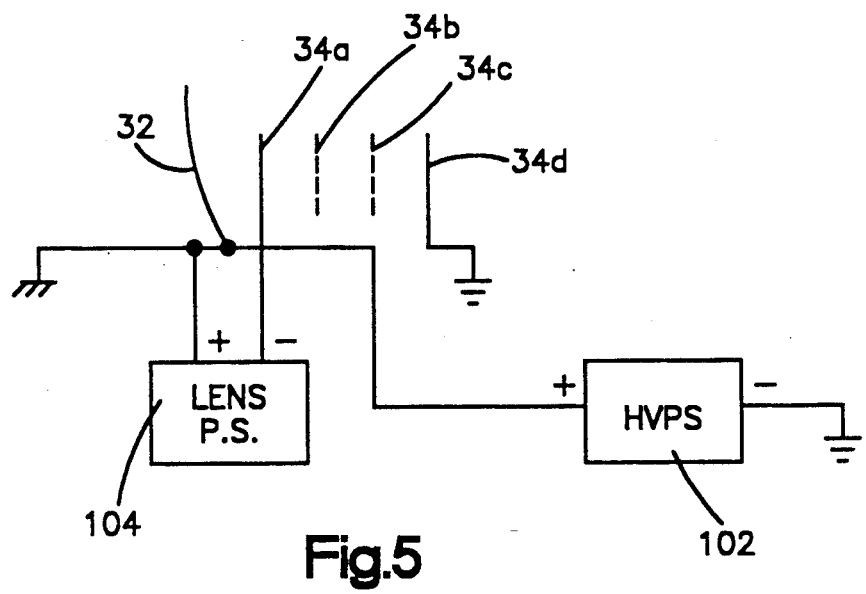
FIG. 5 is an alternate electric energization scheme for the accelerator depicted in FIGS. 2 and 3.

FIG. 5 depicts an alternate energization scheme for the accelerator 30. In this depiction, the exit electrode 34d is grounded and the high voltage power supply 102 has its positive terminal coupled to the entrance electrode 32. The lens power supply provides a potential difference between the entrance electrode 32 and the electrode 34a.

For the configuration depicted in FIG. 1 the desired ion energy is equal to the sum of the electric potential added to ions emitted from the source. The appropriate ion energy is achieved by adjusting the voltage of the high voltage power supply 102. In equation form:

$$hvps = \text{desired energy} - \text{lens power supply} - \text{extraction power supply} \quad (1)$$

For the FIG. 5 configuration, the desired energy is the sum of the high voltage power supply plus the extraction power supply.

$$hvps = \text{desired energy} - \text{extraction power supply} \quad (2)$$

For the FIG. 5 configuration variations in the voltage of the lens power supply 102 do not affect the ion energy but do have some affect on the beam parallelism. Energies as low as the extraction power supply voltage are possible with the FIG. 5 configuration.

The invention has been described in conjunction with multiple alternate embodiments. Although the preferred ion implanter is depicted having voltage polarities suitable for implanting positive ions, a system for implanting negative ions is possible. It is the intent that the invention include all modifications and alterations from these embodiments falling within the spirit or scope of the appended claims.

We claim:

1. An ion beam implant system for controllably treating a workpiece comprising:
   a) source means for providing ions to treat the workpiece;
   b) support means for orienting the workpiece at a location relative the source means;
   c) beam forming means for causing ions emitted by the source means to form an ion beam moving in a first trajectory;
   d) electrode means for deflecting ions in said ion beam away from said first trajectory by a controlled amount;
   e) acceleration means for accelerating ions deflected by said controlled amounts prior to said ions impacting the workpiece; and
   f) control means having an output coupled to said electrode means to adjust the deflecting of said ion beam and thereby control ion beam treatment of the workpiece;
   g) said acceleration means comprising an entrance electrode and one or more additional electrodes for accelerating said ions to an impact energy, said entrance electrode and the first of said additional electrodes biased at voltages for creating a spatially non-uniform electric field that causes ions following diverse trajectories to be redeflected and impact the workpiece at a relatively uniform angle.

2. The ion implant system of claim 1 wherein said electrode means and said acceleration means are fixed and the support means comprises means for moving the workpiece relative to the ion beam to treat an entire workpiece surface.

3. The ion implant system of claim 1 wherein the entrance electrode is an arcuate electrode defining an aperture through which the ion beam passes on its way to the workpiece.

4. The ion implant system of claim 3 comprising at least two additional electrodes, wherein said additional electrodes are spaced, parallel electrode plates having apertures for transmitting ions passing through the aperture in the arcuate electrode to the workpiece.

5. The ion implant system of claim 3 wherein at least one of said additional electrodes comprises a spaced electrode plate having a curved entrance surface that is spaced from a curved surface of the entrance electrode.

6. The ion implant system of claim 5 where the curved entrance surface of the spaced electrode plate has a curvature approximately the same as the curved surface of the entrance electrode.

7. The ion implant system of claim 4 wherein said electrode plates are separated by insulators.

8. The ion implant system of claim 5 wherein said electrode plates are separated by insulators.

9. The ion implant system of claim 1 comprising at least two additional electrodes, wherein a first of the additional electrodes is maintained at a first voltage, a second of the additional electrodes is maintained at a second voltage and the entrance electrode is biased by a lens power supply at a voltage different from the first additional electrode.

10. The ion implant system of claim 9 wherein the lens power supply biases the entrance electrode at a constant electric potential greater than the first additional electrode for creating a static electric field in a region between the entrance electrode and the first additional electrode.

11. The ion implant system of claim 10 wherein positively charged ions are accelerated from the source means by an extraction power supply and where the ion energy striking the workpiece is equal to the sum of the high-voltage power supply, the extraction power supply and the lens power supply.

12. The ion implant system of claim 1 comprising at least two additional electrodes, wherein the entrance electrode is biased at a fixed positive potential by a high voltage power supply and a first of said additional electrodes is biased at a lower potential by a lens power supply while a second of said additional electrodes adjacent an ion beam path downstream from the first additional electrode is maintained at a third fixed potential for accelerating charged ions.

13. The ion implant system of claim 12 wherein the lens power supply biases the first additional electrode at a voltage less than the entrance electrode.

14. The ion implant system of claim 13 wherein ions are accelerated from the source means by an extraction power supply and where the ion energy striking the workpiece is equal to the sum of the high voltage power supply and the extraction power supply.

15. For use with an ion beam implant system, an ion accelerator comprising:
   a) an arcuate entrance electrode biased at a voltage for creating a non-uniform electric field that causes ions following diverse trajectories within said implant system to be deflected and impact a workpiece at a relatively uniform angle;
   b) a plurality of additional spaced electrodes for accelerating said ions to an impact energy before striking the workpiece;
   c) a plurality of insulators separating said electrodes; and
   d) a power supply for electrically biasing the arcuate entrance electrode at a potential different from the plurality of additional electrodes to create the non-uniform electric field and for electrically biasing the plurality of additional spaced electrodes for accelerating the ions.

16. An ion beam implant system for controllably treating a workpiece comprising:
   a) source means for providing ions to treat the workpiece;
   b) support means for orienting the workpiece at a location relative the source means;

c) beam forming means for causing ions emitted by the source means to form an ion beam moving in a first trajectory;

d) electrode means for deflecting ions in said ion beam away from said first trajectory by a controlled amount;

e) acceleration means for accelerating ions deflected by said controlled amounts prior to said ions impacting the workpiece; and f) control means having an output coupled to said electrode means to adjust the deflecting of said ion beam and thereby control ion beam treatment of the workpiece;

g) said accelerator means comprising:
  i) an arcuate entrance electrode symmetric about a non-deflected ion beam path for creating a non-uniform electric field that causes ions following diverse trajectories after passing the electrode means to be redeflected and impact the workpiece at a relatively uniform angle;
  ii) a plurality of additional, spaced, parallel electrode plates for accelerating said ions to an impact energy;
  iii) a plurality of insulators separating said plates; and,
  iv) power supply means for biasing said arcuate entrance electrode relative said plurality of parallel electrode plates wherein a first of the additional electrodes is maintained at a fixed voltage by a high voltage power supply, a second of the additional electrodes is grounded and the entrance electrode is biased by a lens power supply at a voltage higher than the first additional electrode wherein positively charged ions are accelerated to a controlled ion energy when striking the workpiece.

17. The ion beam implant system of claim 16 additionally comprising support means for moving the workpiece in relation to the ion beam.

18. A method for ion beam implanting a workpiece comprising the steps of:
  a) causing a beam of ions to move along an initial trajectory;
  b) orienting the workpiece at a target location;
  c) causing ions to diverge away from the initial trajectory to scan in a back and forth manner to form a narrow ion beam having an extent at least as wide as the workpiece;
  d) redeflecting said ions by generating a static electric field that both redeflects and accelerates ions subsequent to the divergence of the beam; and
  e) moving the workpiece in a back and forth manner to cause ions passing through the static electric field to treat an entire workpiece surface.

19. The method of claim 18 wherein the step of generating the static electric field is performed by biasing an arcuate metallic electrode relative a planar electrode at a location downstream from the region ions diverge from the initial trajectory so that ions enter an aperture in the arcuate electrode, are deflected by the static electric field, and pass through an aperture in the planar electrode before striking the workpiece.

* * * * *